(12) United States Patent
Horak et al.

(10) Patent No.: US 8,735,279 B2
(45) Date of Patent: May 27, 2014

(54) AIR-DIELECTRIC FOR SUBTRACTIVE ETCH LINE AND VIA METALLIZATION

(75) Inventors: David V Horak, Essex Junction, VT (US); Elbert Huang, Carmel, NY (US); Charles W Koburger, Delmar, NY (US); Shom Ponoth, Clifton Park, NY (US); Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 443 days.

(21) Appl. No.: 13/013,108

(22) Filed: Jan. 25, 2011

(65) Prior Publication Data

US 2012/0187566 A1 Jul. 26, 2012

(51) Int. Cl.
*H01L 21/4763* (2006.01)

(52) U.S. Cl.
USPC ........... 438/622; 438/619; 438/627; 438/620; 257/386; 257/522; 257/774; 257/E23.175

(58) Field of Classification Search
USPC .......... 257/386, 522, 774, E23.175, E21.579; 438/619, 627, 620, 622, 638
See application file for complete search history.

(56) References Cited

U.S. PATENT DOCUMENTS

| | | |
|---|---|---|
| 5,668,398 A | 9/1997 | Havemann et al. |
| 6,208,015 B1 | 3/2001 | Bandyopadhyay et al. |
| 6,399,476 B2 | 6/2002 | Kim et al. |
| 6,861,332 B2 | 3/2005 | Park et al. |
| 6,908,829 B2 | 6/2005 | Hussein et al. |
| 7,071,091 B2 | 7/2006 | Clarke et al. |
| 7,329,602 B2 | 2/2008 | Wise et al. |
| 7,595,555 B2 | 9/2009 | Clarke et al. |
| 2009/0066885 A1* | 3/2009 | Kumai ............................ 349/96 |
| 2009/0200636 A1 | 8/2009 | Edelstein et al. |
| 2010/0093168 A1* | 4/2010 | Naik ............................ 438/618 |

* cited by examiner

*Primary Examiner* — Mark A Laurenzi
(74) *Attorney, Agent, or Firm* — Catherine Ivers

(57) ABSTRACT

A method and structure is disclosed whereby multiple interconnect layers having effective air gaps positioned in regions most susceptible to capacitive coupling can be formed. The method includes providing a layer of conductive features, the layer including at least two line members disposed on a substrate and spaced from one another by less than or equal to an effective distance, and at least one such line member also having a via member extending away from the substrate, depositing a poorly conformal dielectric coating to form an air gap between such line members, and exposing a top end of the via.

14 Claims, 13 Drawing Sheets

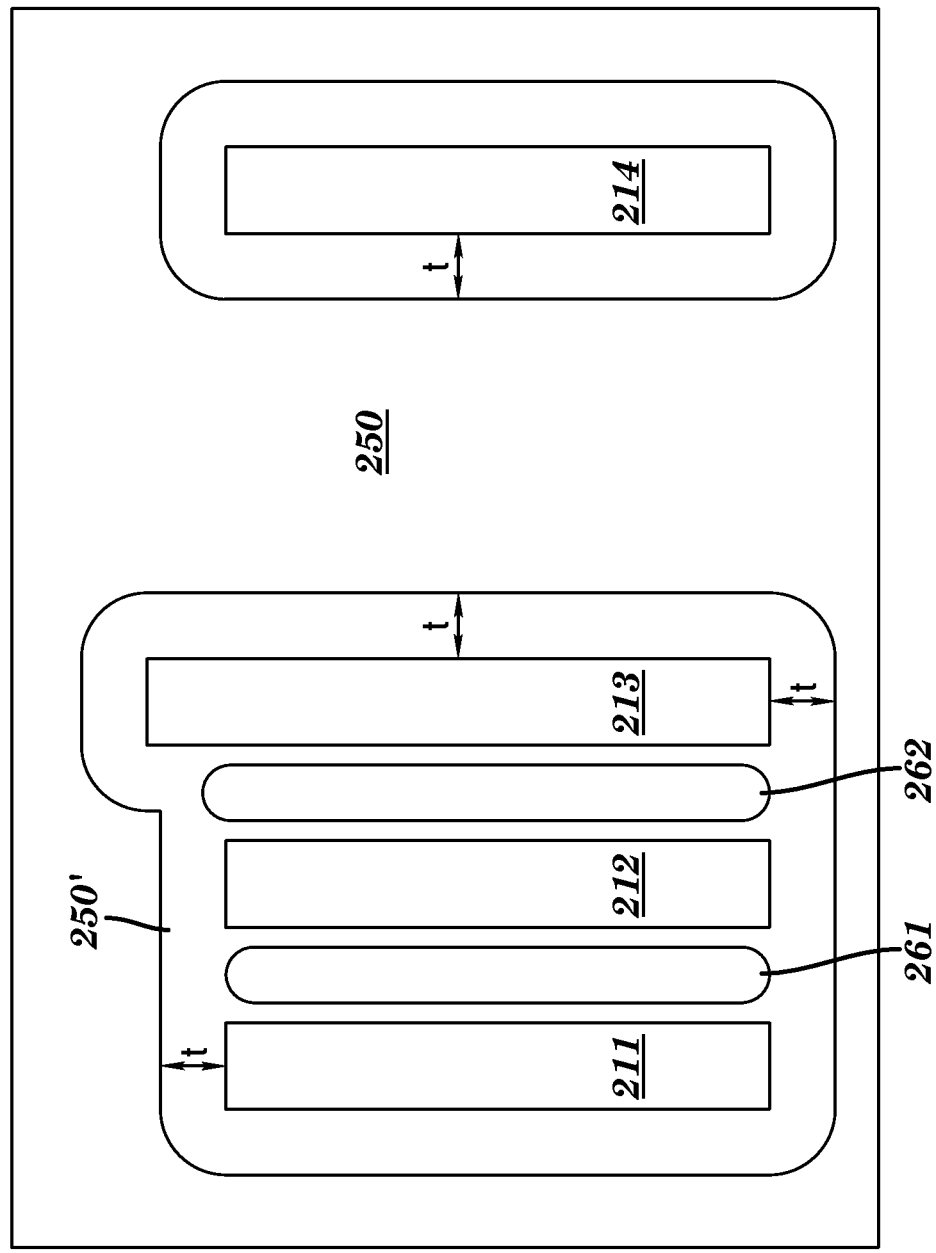

AIR-DIELECTRIC FOR SUBTRACTIVE ETCH LINE AND VIA METALLIZATION

FIELD OF THE INVENTION

The present invention relates to a semiconductor structure, and a method of fabricating the same. More particularly, it relates to nano-scale semiconductor structures selectively isolated by air gaps that can be reliably formed into interconnect metallization with reduced capacitive coupling.

BACKGROUND OF THE INVENTION

Generally, integrated circuits include a complex network of conductive interconnects fabricated on a semiconductor substrate in which semiconductor devices have been formed. Efficient routing of these interconnects requires formation of multilevel or multilayered schemes, such as, for example, single or dual damascene wiring structures.

Within an interconnect structure, conductive vias run perpendicular to the semiconductor substrate and conductive lines run parallel to the semiconductor substrate. According to conventional damascene processing, lines and vias are created within a dielectric layer. A dielectric layer is patterned to create grooves which become lines and holes which become vias. Metal is deposited on the patterned surface such as by electroplating to fill the grooves and holes. Excess is removed, such as by CMP, thereby forming lines along the top of a given dielectric layer, and forming vias which extend below the lines in order to connect to an underlying layer.

There is a continuing need to increase density by, for example, shrinking the size of the conductive interconnects. As feature size continues to decrease, the limitations of copper electroplating to fill features formed in dielectric are increasingly apparent. Copper typically requires a barrier layer to prevent it from migrating and degrading the insulating capacity of surrounding dielectric material. Shrinking the feature size generally requires higher aspect ratios, which are increasingly difficult to fill, and furthermore, the barrier layer cannot scale and hence constitutes a greater fraction of any particular feature.

Feature density can also be increased by reducing the spacing between features, but closely spaced features can suffer from increased capacitive coupling. Low k dielectrics, having k value of 3.0 or less, can be employed but are susceptible to TDDB (time dependent dielectric breakdown) and are challenging to etch, leading to issues such as poor profile control, voids, and collapse. Air gaps have much lower k value approaching 1.0, but pose various fabrication challenges. Several prior art references utilize a sacrificial material, form interconnect structure by dielectric damascene, then remove the sacrificial material to open air gaps below or between such interconnect structure. See, e.g., U.S. Pat. No. 7,595,555, U.S. Pat. No. 7,329,602, U.S. Pat. No. 6,861,332, and U.S. Pat. No. 6,908,829. These techniques require lithography and other processes in order to selectively remove the sacrificial material.

An alternative to forming the interconnect structure by copper damascene is subtractive metal etch ("SME"). U.S. Pat. No. 5,668,398 proposed using a sacrificial layer to fill between SME structures, utilizing lithography steps to remove the sacrificial material, like in the above cases. U.S. Pat. No. 6,399,476 ("Kim et al.") discloses forming air gaps between lines formed by SME by a "multilayer passivation process" that avoids use of a sacrificial material. Referring to FIG. 1A, which is FIG. 4 of Kim et al., an intermetal dielectric layer 104 is disposed over a first metal interconnection 102. Second spaced metal interconnections 106 are formed by depositing a second metal layer over layer 104 and etching according to a patterned photoresist (col. 4, lines 26-39). The photoresist is removed and features 106 are coated with a multilayer dielectric. The first layer 108 is "deposited thickly at the top portion, specifically top sides of the second metal interconnections, while being deposited very thin at the bottom sides" thereby modifying the space between adjacent conductors to have "a relatively narrow opening size as compared to the size of its bottom." (col. 3, lines 50-58 and col. 4, lines 47-66). A second layer 112 of the multilayer dielectric is deposited "to a thickness condition that forms air gaps 114" (col. 5, lines 4-7). A "third conventional passivation layer 116" is then deposited and planarized. According to Kim et al., "a conventional photography process is conducted and a metal contact pad (not shown) is formed in the third passivation layer 116 to the selected second metal interconnections. Subsequently, a process for forming other metal interconnections is further carried out." ['476 col. 5 lines 25-35].

However, a problem with the technique of Kim et al. can arise upon attempting to connect a subsequent layer of metal interconnections. Referring now to FIG. 1B, to do so requires forming a patterned mask 120 and forming openings 121 and 122 through the dielectric to expose an underlying metal wire. As feature sizes shrink, alignment of the mask with underlying wires is increasingly difficult, therefore landing (i.e., forming the vertical interconnect exactly on the underlying wire) is also. Etching through a misaligned opening 122 can pierce layer 112 and form opening 131 into the adjacent air gap 114. Even with better alignment, over etching or just an unfortunately located flaw in layer 112, can puncture the encapsulated air gap. During subsequent deposition of a next metal layer, the open air gap will fill with metal, potentially shorting the adjacent features.

SUMMARY OF THE INVENTION

According to the present invention, the problem of interconnecting multiple layers of metallization, such layers having effective air gaps positioned in regions most susceptible to capacitive coupling, is solved by forming lines as well as vias that extend above such lines within a given layer of conductive material before depositing material to form air gaps between pairs of closely spaced features within that layer. The invention enables reliable formation of semiconductor interconnect structures without multiple additional lithography steps or sacrificial dielectric material.

According to one embodiment, a method to form interconnected metallization layers includes: providing a layer of conductive features, the layer including at least two line members disposed on a substrate and spaced from one another by less than or equal to an effective distance, and at least one such line member also having a via member extending away from the substrate, depositing a coating to form an air gap between such line members; and exposing a top end of the via. The coating can include a poorly conformal dielectric layer. The method can further include forming a dielectric layer having a substantially flat top surface over said layer of conductive features prior to said exposing step. The at least two line members can be spaced by a gap having an aspect ratio of greater than or equal to 2.0. The method can further include forming an opening into such an air gap, and least partially filling such opened air gap.

Another embodiment of the present invention provides a structure that includes a first interconnect layer disposed between a substrate and a second interconnect layer, the first layer having two first-layer features laterally separated by a gap, each first-layer feature including a line member and at least one of the first-layer features having a vertical member extending from a first-layer line member to a second-layer feature in the second interconnect layer. The structure includes an ILD layer disposed over top surfaces of the first-layer line members, where a bottom surface of said ILD layer defines a void in such gap. The second interconnect layer overlies the ILD layer and is conductively isolated from the first-layer line members except by the vertical member. The first-layer features can be formed of a metal that can be dry-etched.

In yet another embodiment of the invention, a method is provided to form interconnect wiring layers by providing a layer of conductive features, the features including line members disposed on a substrate and a via extending up from at least one such line member; depositing ILD over the conductive features such that an air gap is formed between adjacent line members where they are separated by an effective distance; exposing a top surface of the via; and forming a second conductive layer over the ILD, such second conductive layer conductively contacting the top surface of the via. The method can include forming a dielectric layer having a substantially flat top surface above said via prior to the exposing step. The first-layer features can be formed by subtractive metal etch. The exposing step can be achieved without photolithography.

BRIEF DESCRIPTION OF THE DRAWINGS

FIGS. 3A and 3B show respectively a cutaway side view and a plan view at height BB of the structure of FIG. 2B after deposition of a dielectric layer over the conductive features.

DETAILED DESCRIPTION OF THE INVENTION

Embodiments of the present invention will now be described in greater detail by reference to the drawings that accompany the present application. It is noted that the drawings of the present application are provided for illustrative purposes only and are not drawn to scale.

In the following description, numerous specific details are set forth, such as particular structures, components, materials, dimensions, processing steps and techniques, in order to provide a thorough understanding of the present invention. However, it will be appreciated by one of ordinary skill in the art that the invention may be practiced without these specific details. In other instances, well-known structures or processing steps have not been described in detail in order to avoid obscuring the invention.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Figure 1A:
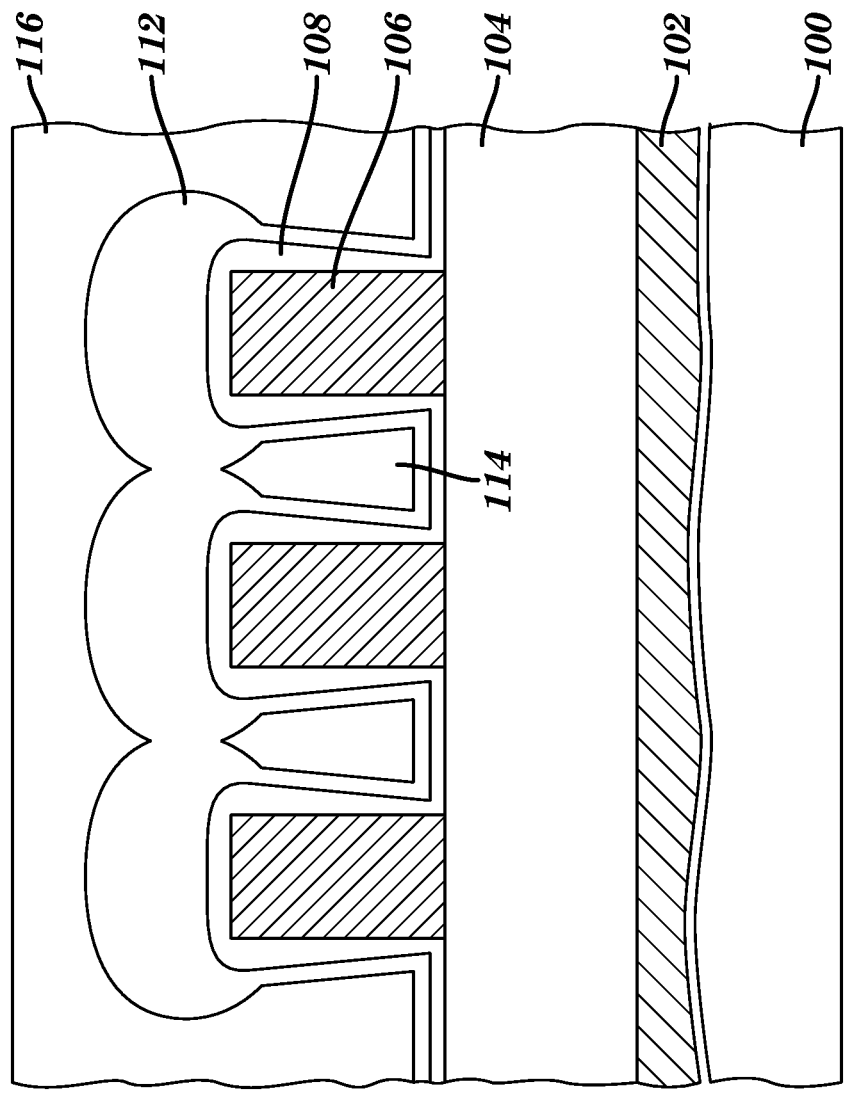
FIGS. 1A and 1B show a prior art interconnect structure employing an air gap.
Figure 1B:
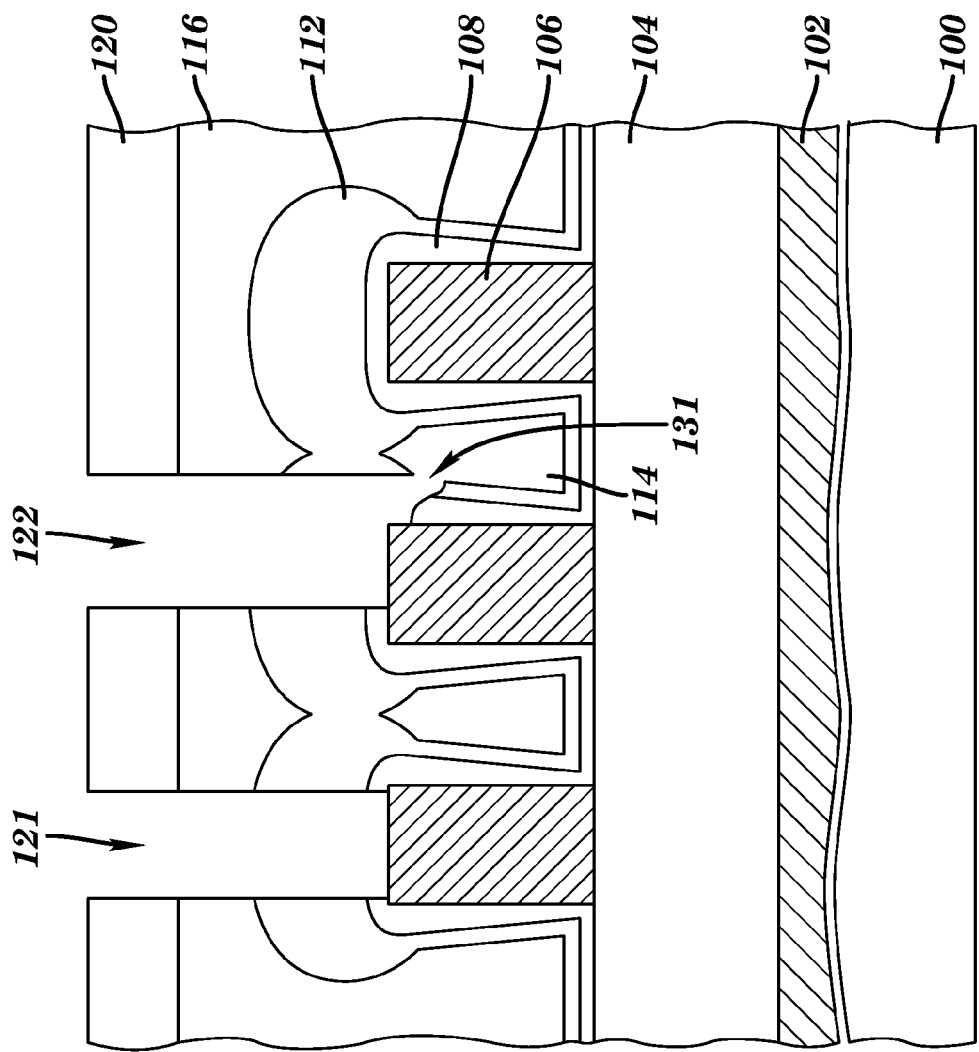
Figure 2A:
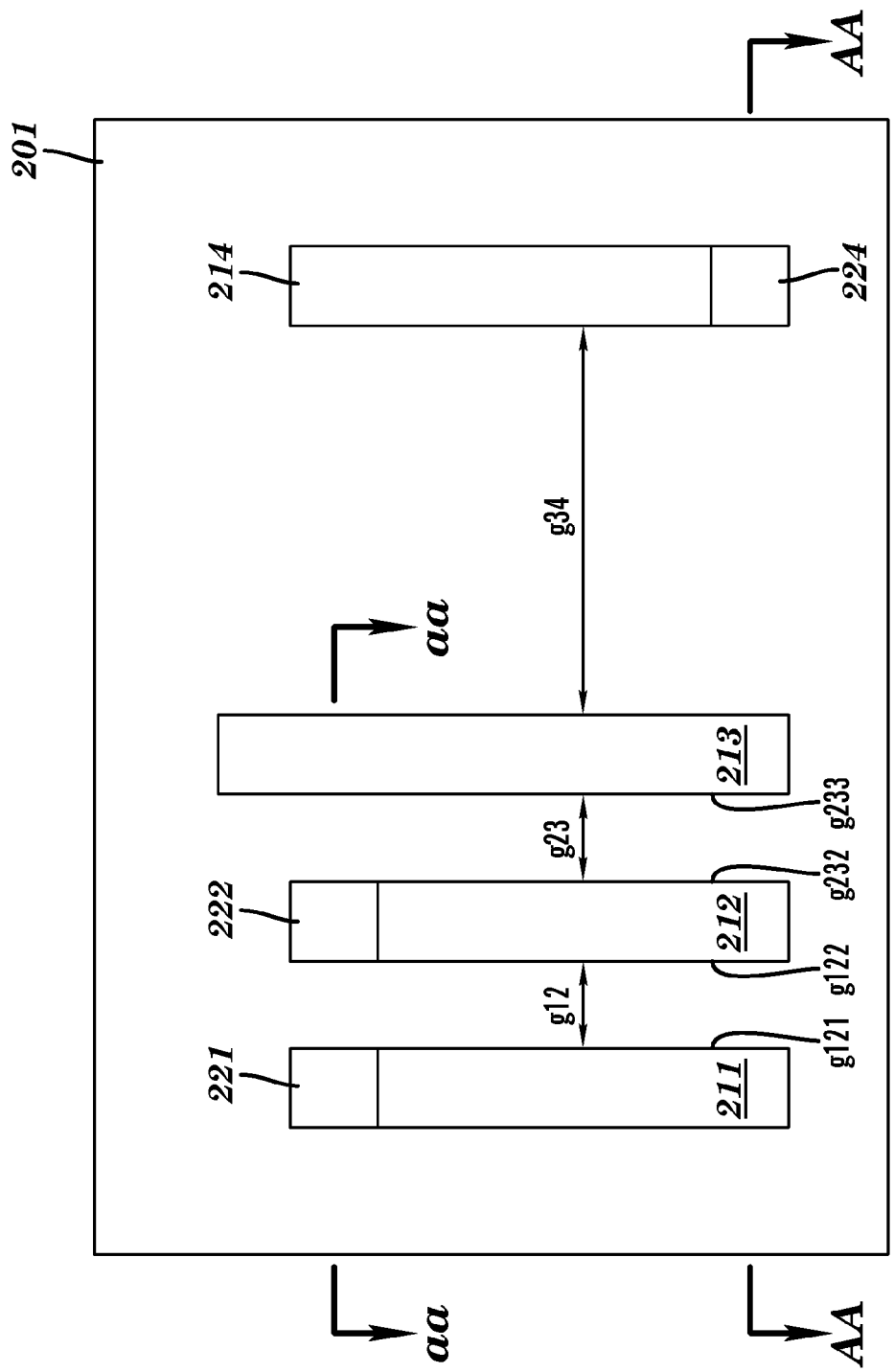
FIGS. 2A and 2B show respectively a plan and perspective view of exemplary conductive features of an interconnect structure layer according to an aspect of the present invention.
Figure 2B:
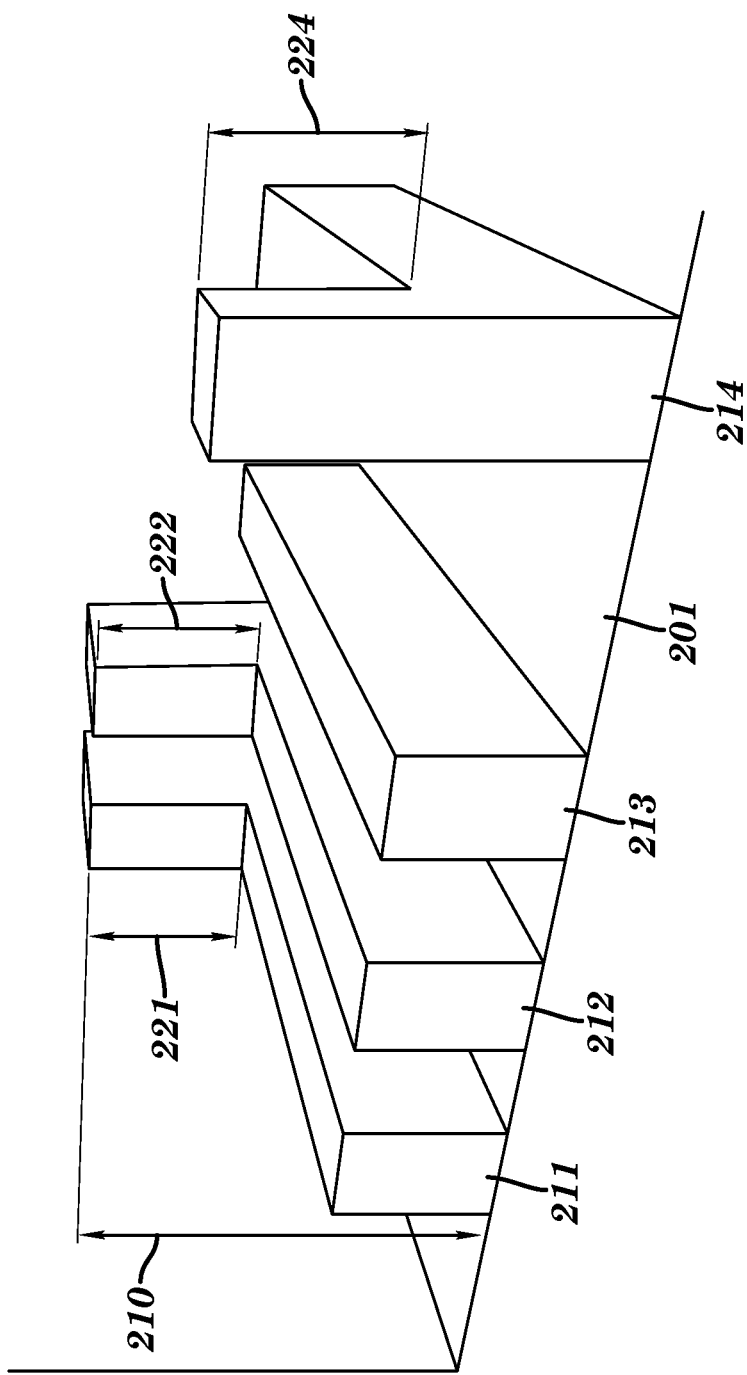

Referring now to FIGS. 2A and 2B, the method according to an embodiment of the present invention employs a conductive layer 210 formed into a plurality of lines 211, 212, 213, and 214 disposed on substrate 201. Substrate 201 may comprise a semiconducting material, a conductive material or combinations thereof. If substrate 201 comprises a semiconducting material, it can be any semiconducting material such as Si, SiGe, SiGeC, SiC, Ge alloys, GaAs, InAs, InP and other III/V or II/VI compound semiconductors. The semiconducting material can also be a layered semiconductor such as, for example, Si/SiGe, Si/SiC, silicon-on-insulators (SOIs) or silicon germanium-on-insulators (SGOIs). Further, the semiconducting material of substrate 201 can be single crystalline, polycrystalline, amorphous, or have a combination of at least two of a single crystalline portion, a polycrystalline portion, and an amorphous portion. In addition to these listed types of semiconducting materials, the present invention contemplates cases in which substrate 201 is a layered semiconductor such as, for example, Si/SiGe, Si/SiC, silicon-on-insulators (SOIs) or silicon germanium-on-insulators (SGOIs). When the substrate comprises a semiconducting material, one or more semiconductor devices such as, for example, complementary metal oxide semiconductor (CMOS) devices can be fabricated thereon. The top surface of substrate 201 may comprise an insulating material, which can be an organic insulator, an inorganic insulator or a combination thereof including multilayers.

If substrate 201 comprises a conducting material, it can be, for example, polySi, an elemental metal, alloys of elemental metals, a metal silicide, a metal nitride or combinations thereof including multilayers. When the substrate comprises a combination of an insulating material and a conductive material, the substrate may represent a first interconnect level of a multilayered interconnect structure. Though not shown in the Figures, the interconnect structure of metal layer 210 can connect to interconnect structure or devices within substrate 201.

Referring now to FIG. 2B, vias 221, 222, and 224 extend respectively from lines 211, 212, and 214, extending up or away from substrate 201. Line 212 is spaced from line 211 by a gap g12, so gap g12 is defined by facing sides surfaces g121 (of line 211) and g122 (of line 212). Line 213 is spaced from line 212 by a gap g23, which has side surfaces g232 and g233. Line 214 is spaced from line 213 by a gap g34. Vias 221, 222, and 224 can have the same width as the line from which they extend. FIG. 2B shows vias 221, 222, and 224 with depth approximately equal to width, and with a rectilinear cross section. Note that although the lines and vias are illustrated as having flat, vertical sides, features can be formed to various shapes including sloped or curved sides, or unequal heights, and vias can have ovate or round cross section, any of which can be employed within the present invention.

The lines and vias of conductive layer 210 can be formed by a subtractive metal etch process, such as that described in co-pending application U.S. application Ser. No. 12/885,665, hereby incorporated by reference. Conductive layer 210 can be any conductive material that can be dry etched or patterned (such as W) including but not limited to Al, Cr, Hf, Ir, Mo, Nb, Os, Re, Rh, Ru, Ta, Ti, W, V, Zr, and alloys thereof. Conductive layer 210 is preferably formed by one or more of Aluminum, Ruthenium, Tantalum, Titanium or Tungsten. Conductive layer 210 can be a single, integral layer comprising a single deposition of conductive material, or can be a composite of two or more layers, which layers can be the same material or can comprise two or more separately deposited materials. Optionally, lines may be formed of an earlier-deposited material comprising layer 210, while vias are formed of a later-deposited material comprising layer 210.

Subtractive metal etch can define conductive features spaced by a minimal dimension, such as the critical dimension ('CD') for a particular lithography node, and form high aspect ratio gaps. At any point between adjacent lines, the aspect ratio ('AR') would be the height of such point vs the separation between the lines at that given point. Between adjacent vias, the aspect ratio is the depth (i.e., the distance perpendicular to the separation and to the height) to which facing surfaces of adjacent vias are parallel vs the separation between the vias. When at least one of adjacent vias has a round cross section, there is essentially no depth of facing surfaces, so the aspect ratio is practically zero. Accordingly, the shape of adjacent conductive features determines the aspect ratio of an intervening gap. Between adjacent lines, the aspect ratio of a gap can be well above 1.0, such as between 2.0 and 10.0, and can be even higher.

Figure 3A:
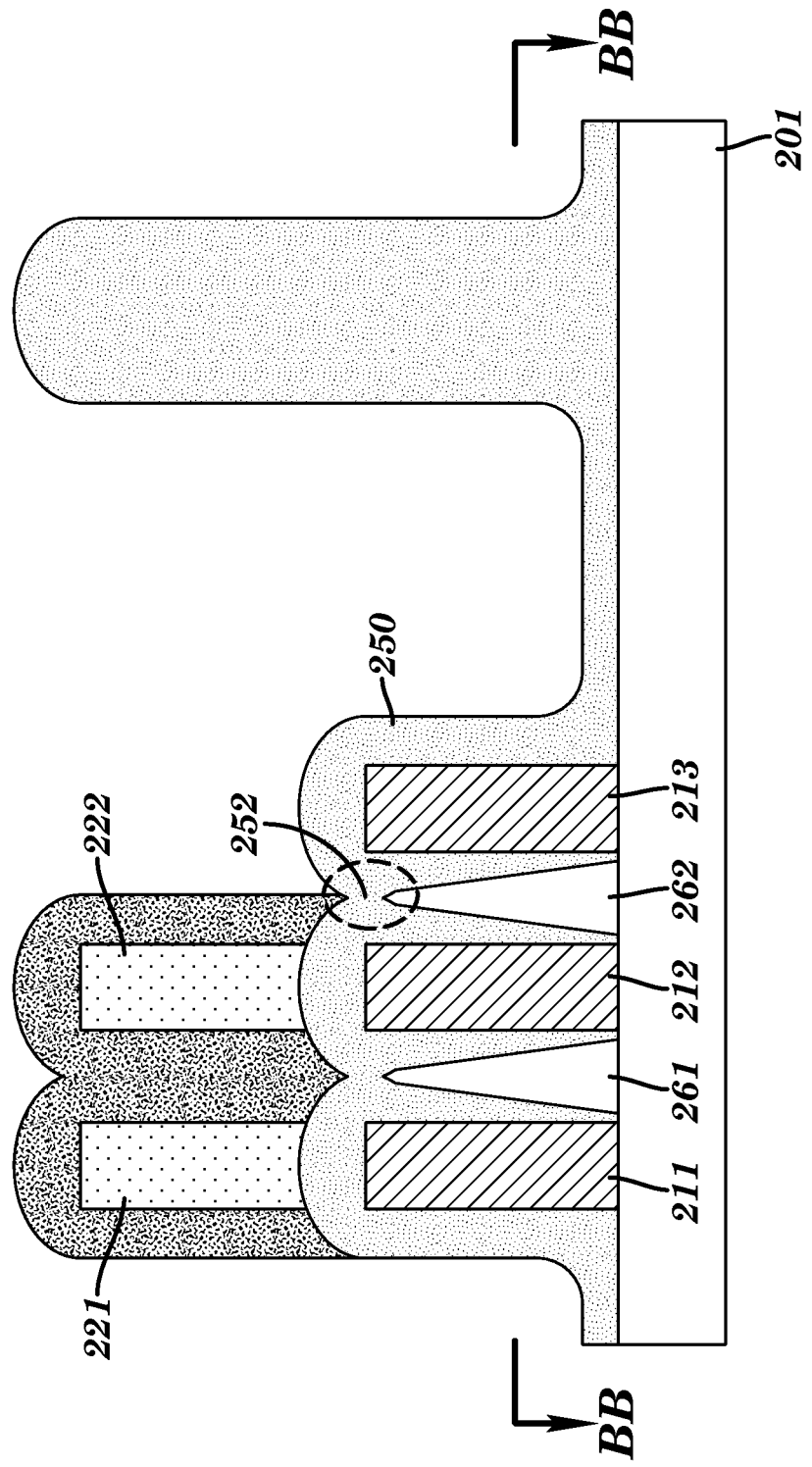

A poorly conformal dielectric layer can be deposited over exposed surfaces by known processes. Referring to FIG. 3A, a layer 250 of dielectric material can be deposited over the structure of FIG. 2B. Layer 250 can be formed of any dielectric material that can form a poorly conformal layer, which material can be $SiO_2$, NBlock, or SiCOH, or combinations thereof. As the layer forms across the top and other well-exposed surfaces of line members, including, e.g., the top edges of sides g232 and g233 that constitute the sides of gap g23, the layer can pinch together 252, restricting and eventually preventing further material from entering the deeper regions of the gap. This tendency is leveraged in the present invention to form air gaps 261 and 262 respectively in gaps g12 and g23. The upper portion of air gap 261 is defined by an interior or lower surface of layer 250. The lower portion of air gap 261 is defined by the substrate and lower surfaces of the facing sidewalls g121 and g122, to the extent such lower and substrate surfaces are not coated by dielectric layer 250. Air gap 262 is similarly defined except involving the facing sidewalls of lines 212 and 213.

The effective distance or spacing between features ('AG') that is sufficient to form an air gap is a function of the gap aspect ratio and the thickness of layer 250, as well as the deposition process and properties of layer 250. AG can be substantially larger than CD. So long as features are separated by less than or equal to the effective distance, a void or air gap can be formed in the intervening gap. The larger the aspect ratio of the gap, the more effective an air gap can be formed.

FIG. 3A shows the features of FIG. 2B covered with layer 250, cut away at line AA of FIG. 2A across lines 211, 212, and 213, and cut away at line aa of FIG. 2A across vias 221 and 222. As noted, the layout of the features of layer 210 can be designed and arranged such that gap g12 has a sufficiently high aspect ratio and width less than AG, to reliably form air gap 261 between lines 211 and 212. According to the present invention, vias 221 and 222 can be configured such that layer 250 fills the space between the vias as shown in FIG. 3A. For example, if either via had a round cross section, then deposition of layer 250 to form air gap 261 can fully fill the space between vias 221 and 222. If the vias have facing flat sides, then so long as the extent (depth) of such facing sides is less than or equal to the separation between the vias, deposition of layer 250 to form air gap 261 can fill the space between vias 221 and 222.

FIG. 3B shows, at height BB of FIG. 3A, air gaps 261 and 262 formed respectively between lines 211 and 212 and between lines 212 and 213. Just as layer 250 can pinch off the top of an air gap by forming a thick layer over adjacent upper edges of closely spaced features, FIG. 3B shows that layer 250' (at height BB) can also pinch off the ends of an air gap. Between lines 211 and 212 which are the same length, parallel, and aligned, air gap 261 has about the same length the adjacent lines. Between lines 212 and 213, which are parallel and aligned the full length of 212 but line 213 is longer so they are not aligned on one end, air gap 262 may be slightly longer than line 212. If adjacent parallel lines (spaced less than AG) were offset, then an air gap could be formed essentially just between the overlapped portion. Layer 250' has approximately uniform thickness, t, on the surfaces and ends of the layer 210 features that are more than a distance AG from another layer 210 feature, and is substantially thinner or nonexistent along the sides of the air gaps, that thickness depending on the height of BB. Gap g34 between lines 213 and 214 is greater than AG, so no air gap forms between those features.

Figure 4:
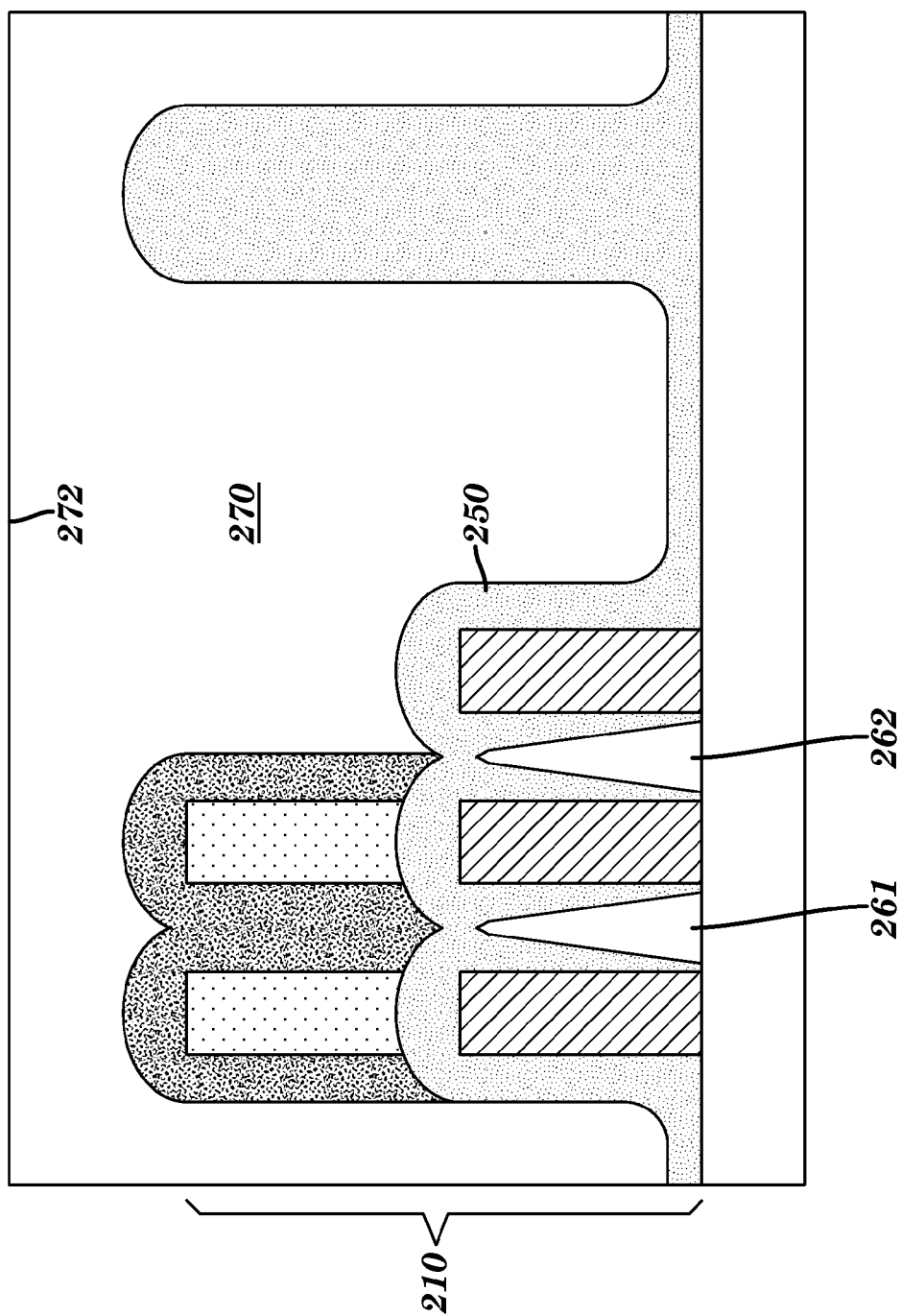
FIGS. 4 and 5 show the structure of FIG. 3A after filling the interconnect structure layer.

Referring now to FIG. 4, insulation layer 270 can be formed over layer 250 to a depth equal to or greater than the vertically extending vias. Since layer 250 can form a continuous surface over and around lines and vias of conductive layer 210, insulation layer 270 can fill above layer 250, while voids 261 and 262 remain sealed and unfilled. Dielectric material 270 can be any interlevel or intralevel dielectric (ILD), including inorganic dielectrics or organic dielectrics, and can be porous or non-porous. Examples of suitable dielectrics that can be used as dielectric material 270 include, but are not limited to SiN, SiC, $SiO_2$, silsesquioxanes, C doped oxides (i.e., organosilicates) that include atoms of Si, C, O and H, including porous versions of the foregoing, or combinations thereof. Dielectric material 270 can be deposited utilizing any conventional deposition process including, but not limited to chemical vapor deposition (CVD), plasma enhanced chemical vapor deposition (PECVD), spin-on coating, evaporation, and chemical solution deposition. Spin-on coating can be preferable by resulting in less overburden and thereby reducing the need for or demand upon a subsequent planarization step such as CMP. If layer 250 did not fully pinch off the top or sides of an air gap, the material of layer 270 should have a viscosity high enough that it does not fill the air gap upon spin-on or other deposition.

Figure 5:
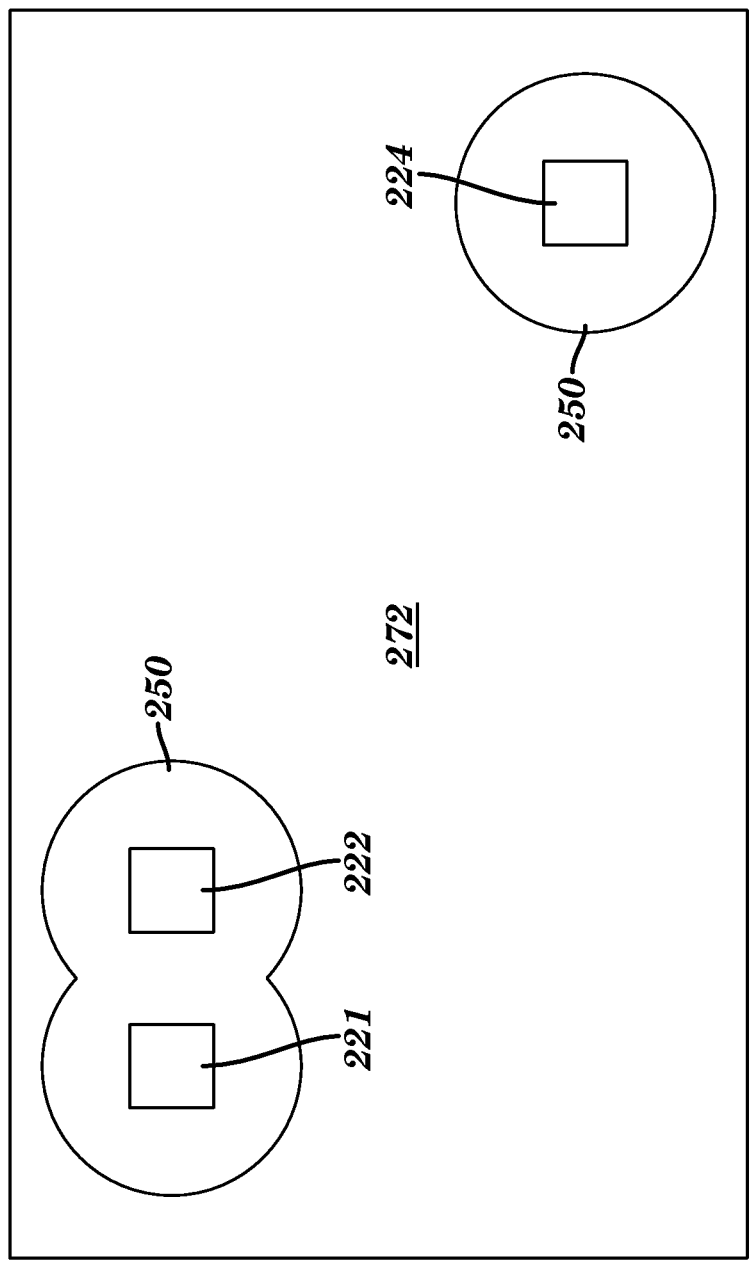

Layer 270 can be planarized or can be formed with a substantially flat top surface 272. Surface 272 can be masked and etched by conventional lithography to expose top ends of vias 221, 222, and 224, but according to the present invention, the via top ends can be exposed without using a mask. The entirety of surface 272 can be recessed to expose the via ends as shown in FIG. 5 by any method including chemical mechanical polish (CMP) or any etching process (including dry etching and chemical wet etching) that selectively etches the dielectric materials 270 and 250. Typically, the dielectric recess process employed in the present invention includes a chemical etching process or a reactive ion etching process. Alternatively layer 270 can be formed having top surface 272 roughly coplanar with the via top ends such that minimal removal, such that ILD etch back, rather than CMP, is sufficient to smooth the surface and expose the top ends of vias 221, 222, and 224. According to an embodiment, layer 270 can be recessed more deeply whereby the top ends and the top-most side surfaces of vias 221, 222, and 224 are exposed (see FIG. 6A). Recessing can be achieved by conventional processing using wet or dry etching, or in the case of a low-k dielectric by O2 plasma followed by HF etch.

The features of layer 210 can be configured so that air gaps only form between the lines yet do not substantially extend into the space between the vias. As such, at least the top ends and optionally even a substantial portion of the upper side surfaces of the vias can be exposed while an effective thickness M of dielectric material separates the recessed surface 272 from any underlying air gap.

The invention contemplates multiple interconnect layers, at least one such layer having conductive lines within a lower portion of the layer and at least one via conductively extending to an overlying layer, the depth of such at least one layer substantially filled by dielectric material such that the conductive features are embedded (except where air gaps form). As is known, in addition to the conductive and dielectric materials already identified, the at least one such interconnect layer can also include inter-level insulating barrier layers.

Figure 6A:
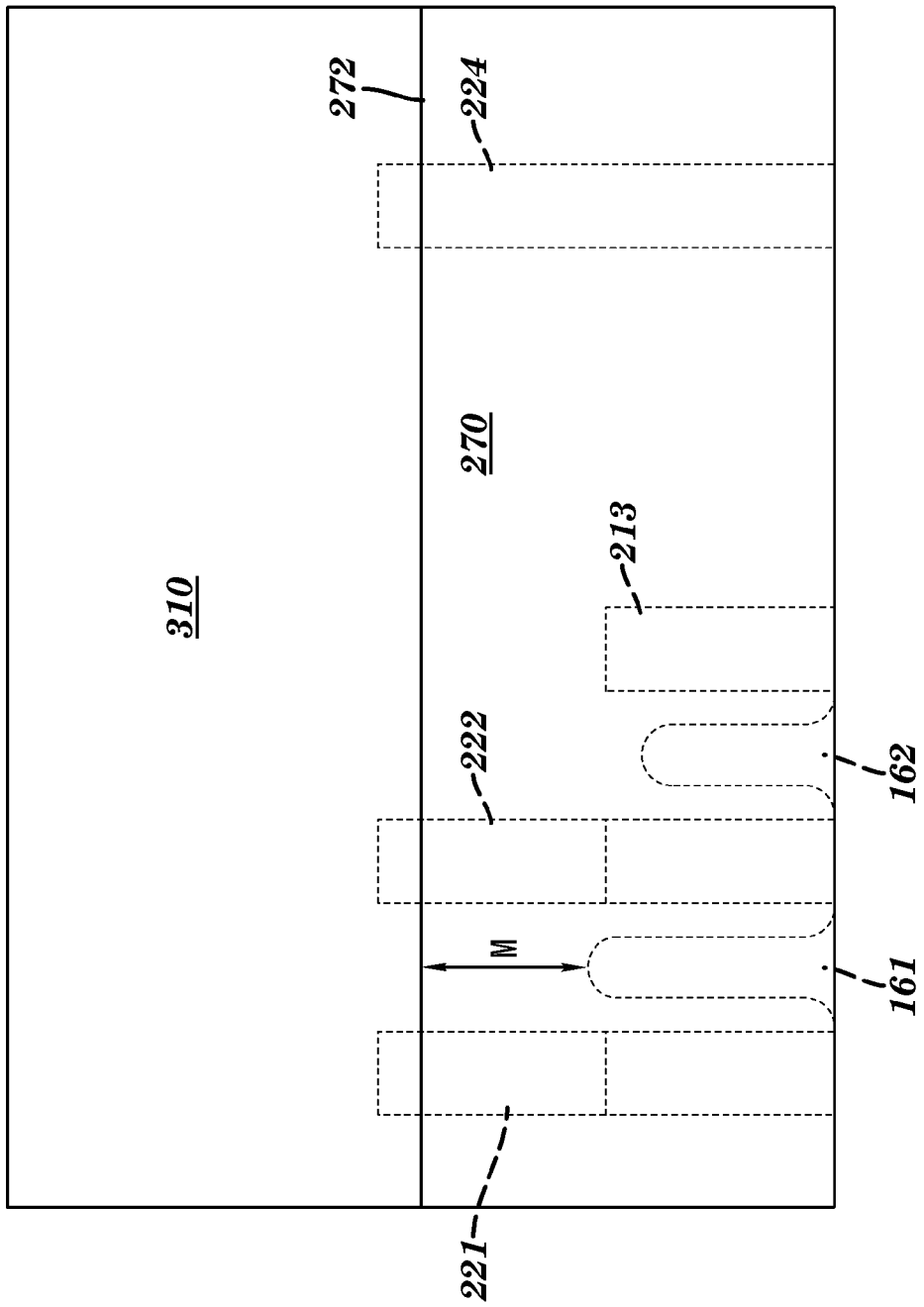
FIGS. 6A and 6B show a second layer of interconnect structure on a first layer of interconnect structure according to an embodiment of the present invention.

As shown in FIG. 6A, a second conductive layer 310 can be formed over surface 272 and in conductive contact with vias of layer 210 without undue risk of breaching and having metal partially fill the embedded air gaps. So long as the at least one via of layer 210 extends above an associated line by distance greater than M, then the dielectric stack within which layer 210 is embedded can be recessed to expose the via ends without employing any lithography or mask.

Figure 6B:
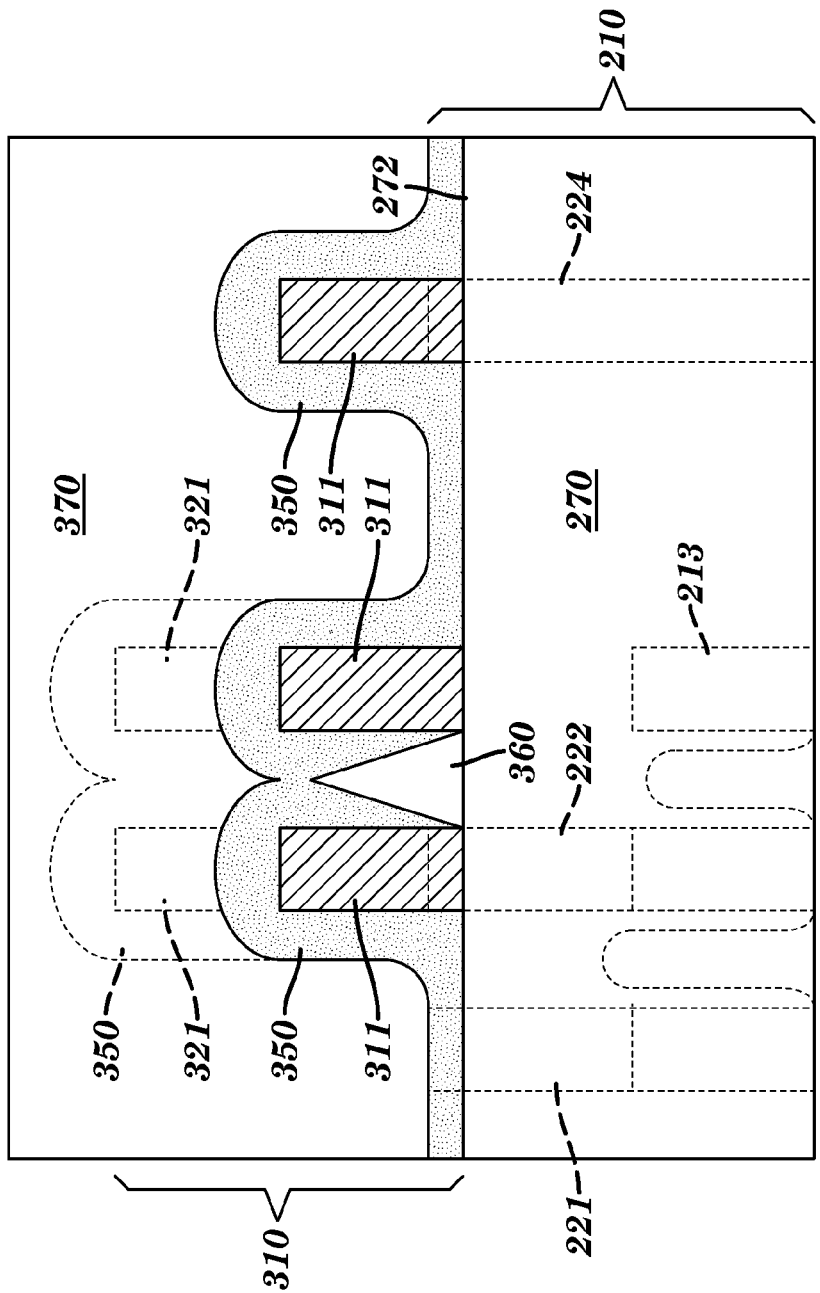

Referring to FIG. 6B, layer 310 can be patterned to form a second interconnect layer conductively connected to the features of layer 210. Just as described above, layer 310 can be patterned to form a plurality of lines 311 and at least one via 321 extending from one of such plurality. Deposition of layer 350 (which can be formed of the same material and by the same process as layer 250) can form air gaps 360 between closely spaced lines, while filling between adjacent vias. Deposition and planarization or recess of layer 370 (which can be formed of the same material and by the same process as layer 270) can complete a second interconnect layer in conductive contact with a first interconnect layer.

Figure 7:
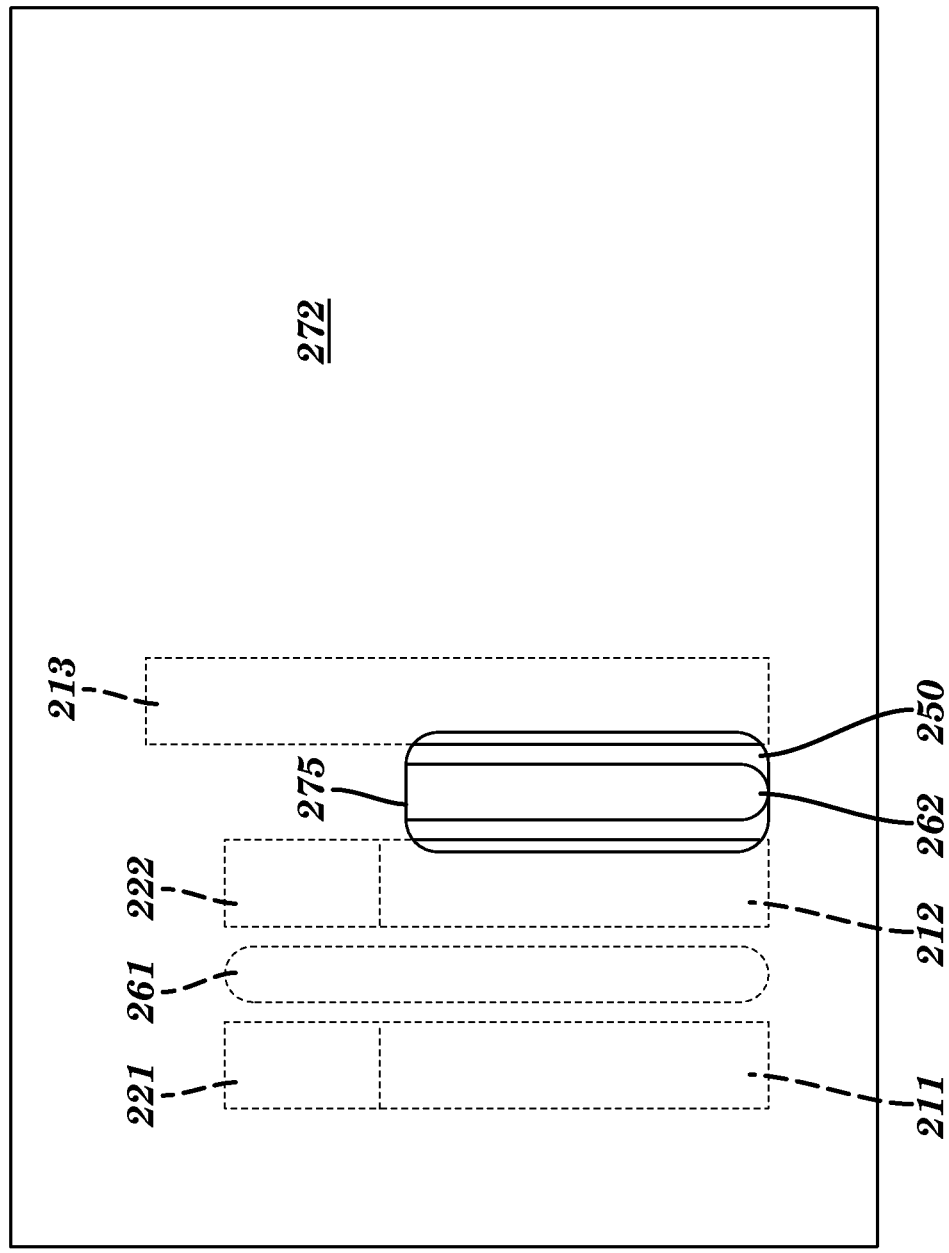
FIG. 7 shows an opening formed over an air gap according to an embodiment of the present invention.
Figure 8A:
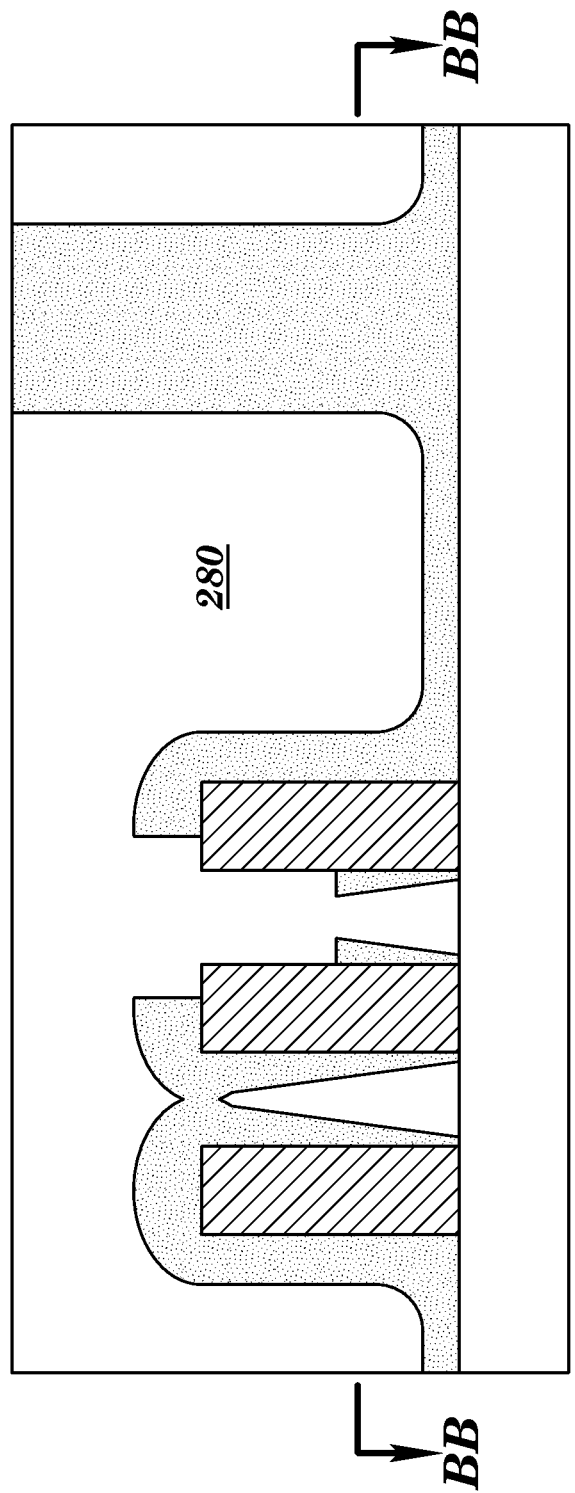
FIGS. 8A and 8B show a cutaway side view and a top view at height BB of the structure of FIG. 7 after a deposition process step.
Figure 8B:
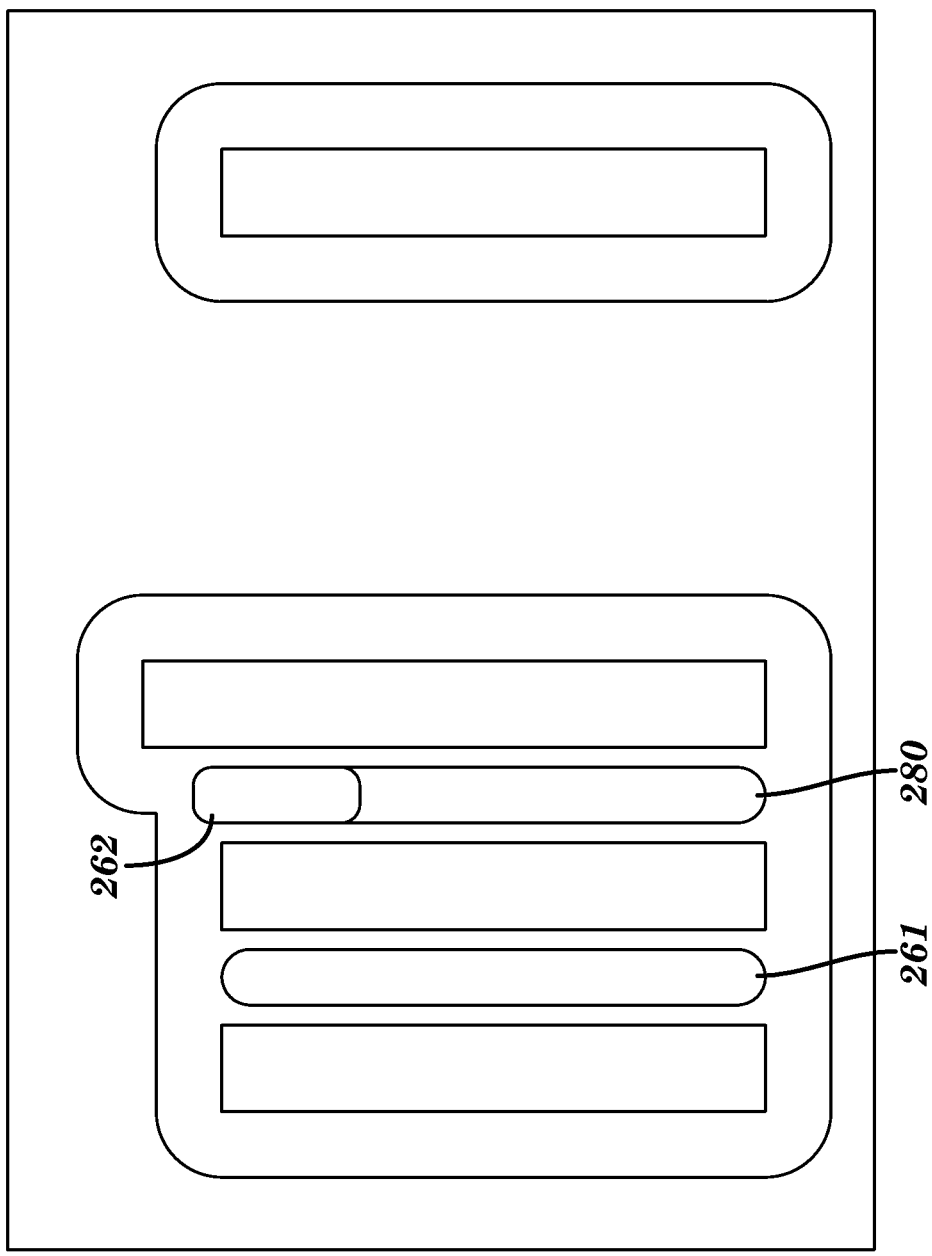

As described, the present invention can be used to form air gaps within a layer of conductive features just between closely spaced lines. According to another embodiment, it may be preferable to replace an air gap with a different insulation. For example, there may be closely spaced lines separated by a kerf region or between which heat dissipation is more critical than low dielectric properties. For whatever reason, the present invention also encompasses a method to selectively remove an air gap formed by the techniques described above. Referring again to FIG. 4, layer 270 can be deposited over layer 250, but in this embodiment layer 270 can be a patterning film or stack of films terminating in patterned photoresist, which can be deposited by spin-coating thereby forming a substantially flat top surface 272, and can be patterned and developed by conventional methods. For example, as shown in FIG. 7, surface 272 can be patterned to form an opening 275 aligned over air gap 262 between lines 212 and 213. Opening 275 can be sized to expose the full extent of the underlying air gap, or just a portion as shown in FIG. 7. That portion of layer 250 exposed by opening 275 can be etched to open air gap 262. The etch process can be timed or otherwise controlled to eliminate the material of layer 250 under opening 275. The material can be partially or completely removed. Referring now to FIG. 8A, remnants of patterning film 270 can optionally be removed and deposition of dielectric layer 280 can fill the opened gap. Air gap 262 can be eliminated or just trimmed by adjusting the extent to which the material of layer 250 is removed within opening 275 and the properties and process for depositing dielectric layer 280. FIG. 8B illustrates that at height BB above substrate 201, air gap 262 is now trimmed.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A method to form interconnected metallization layers, the method comprising:
   providing a layer of conductive features including at least two line members disposed on a substrate, at least one said line member connected to a via member extending away from said substrate, said at least two said line members spaced from one another by less than or equal to an effective distance;
   depositing a coating to form an air gap between said line members; and
   exposing a top end of said via;
   forming an opening into said air gap, and
   depositing dielectric material onto said coating and at least partially filling said opened air gap.

2. The method of claim 1 wherein said coating comprises a poorly conformal dielectric layer.

3. The method of claim 1 further comprising;
   forming a dielectric layer having a substantially flat top surface over said layer of conductive features prior to said exposing step.

4. The method of claim 2 wherein coating has a nominal thickness and said via has a height greater than said nominal thickness.

5. The method of claim 1 wherein said at least two line members are spaced by a gap, said gap having an aspect ratio greater than 2.

6. The method of claim 5 wherein said aspect ratio is between 3 and 10.

7. The method of claim 1 further comprising:
   forming a second conductive layer in conductive contact with said top end.

8. A method to form interconnect wiring layers comprising:
   providing a layer of conductive features each having a line member disposed on a substrate, and a via extending up from at least one said line member;
   depositing ILD over said conductive features, said ILD forming an air gap between adjacent said line members where they are separated by an effective distance;
   exposing a top surface of said via,
   forming a second conductive layer over said ILD, said second conductive layer conductively contacting said top surface of said via,
   wherein said exposing step is achieved by recessing said ILD without photolithography, and
   wherein recessing exposes top sides as well as the top end of said via.

9. The method of claim 8 wherein said providing step comprises:
   depositing a conductive layer on said substrate, and
   etching said conductive layer to form said conductive features.

10. The method of claim 9 wherein said adjacent line members are separated by a gap having an aspect ratio greater than 2.

11. The method of claim 8, wherein said ILD comprises a coating having a nominally uniform thickness over said conductive features and said via has a height greater than said thickness.

12. The method of claim 8 wherein an adjacent pair of conductive features each include a via member, at least one of said via members having a substantially round cross section.

13. The method of claim 8 further comprising:
    forming an opening into said air gap, and
    depositing second dielectric material onto said ILD and at least partially filling said air gap.

14. The method of claim 13, wherein said forming an opening includes selective removal through a mask.

* * * * *